(12) United States Patent
Yen et al.

(10) Patent No.: US 7,591,649 B2
(45) Date of Patent: Sep. 22, 2009

(54) CIRCUIT BOARD AND LIGHT EMITTING DIODE BASED ILLUMINATION DEVICE INCORPORATING SAME

(75) Inventors: Ta-Hsiang Yen, Miao-Li Hsien (TW); Yen-Hung Huang, Miao-Li Hsien (TW); Chih-Ming Lai, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 0 days.

(21) Appl. No.: 12/100,294

(22) Filed: Apr. 9, 2008

(65) Prior Publication Data
US 2009/0047802 A1 Feb. 19, 2009

(30) Foreign Application Priority Data
Aug. 13, 2007 (CN) ............... 200710201348

(51) Int. Cl.
*H01R 12/00* (2006.01)
(52) U.S. Cl. .................. 439/65; 439/493; 439/591; 362/619
(58) Field of Classification Search .......... 439/56, 439/61, 65, 66, 67, 74, 77, 91, 493, 495, 439/591; 362/611, 612, 613, 617, 619, 631
See application file for complete search history.

(56) References Cited

U.S. PATENT DOCUMENTS

| | | | | |
|---|---|---|---|---|
| 4,513,064 A | * | 4/1985 | Marcus | 428/582 |
| 5,110,298 A | * | 5/1992 | Dorinski et al. | 439/65 |
| 5,219,292 A | * | 6/1993 | Dickirson et al. | 439/67 |
| 5,244,395 A | * | 9/1993 | DeSantis et al. | 439/65 |
| 5,885,109 A | * | 3/1999 | Lee et al. | 439/652 |
| 6,422,876 B1 | * | 7/2002 | Fitzgerald et al. | 439/61 |
| 6,711,860 B2 | * | 3/2004 | Fleishman | 52/81.3 |
| 7,160,140 B1 | * | 1/2007 | Mrakovich et al. | 439/417 |
| 2003/0223235 A1 | * | 12/2003 | Mohacsi et al. | 362/240 |
| 2006/0286858 A1 | * | 12/2006 | Uchida et al. | 439/495 |
| 2007/0137886 A1 | * | 6/2007 | Yen | 174/250 |
| 2009/0015764 A1 | * | 1/2009 | Su et al. | 349/106 |

OTHER PUBLICATIONS

Atsushi Okuno et al., Unique White LED Packaging Systems, 2003 IEEE Electronic Components and Technology Conference.

* cited by examiner

*Primary Examiner*—James Harvey
(74) *Attorney, Agent, or Firm*—Andrew C. Cheng

(57) ABSTRACT

An illumination device using LEDs (101) has a circuit board and a plurality of LEDs disposed on the circuit board elements. The circuit board can be obtained by assembling a plurality of the circuit board elements (11) together. The circuit board element comprises a board (110) and an electric trace (1151) attached to the board. The board comprises a plurality of connecting units (111, 112, 113, 114) formed at lateral sides thereof. The circuit board element connects with an adjacent circuit board element via the connecting units. The electric trace extends from the board to the connecting units and electrically connects with the electric trace of the adjacent circuit board element.

20 Claims, 4 Drawing Sheets

CIRCUIT BOARD AND LIGHT EMITTING DIODE BASED ILLUMINATION DEVICE INCORPORATING SAME

BACKGROUND OF THE INVENTION

1. Field of the Invention

The present invention relates to a display device, and more particularly to a display device using a light emitting diode.

2. Description of Related Art

Conventional display devices may include a lamp box and a fluorescent lamp used as a light source for the display device and received in the lamp box. However, the fluorescent lamp has many disadvantages such as low light efficiency, short life, and polluted to the environment. Light emitting diodes (LEDs), on the other hand, have many advantages, such as high luminance, low power consumption, highly compatible with integrated circuits, long-term reliability, and environment friendliness and so are becoming more widely used in display devices, as described in an article entitled "Unique White LED Packaging Systems" cited in a publication of 2003 IEEE Electronic Components and Technology Conference written by Atsushi Okuno.

There is, however, a drawback to the way LEDs are currently used in large display devices. As is well known, the farther light travels through a medium, the more intensity is lost. In a display device with a large-sized panel, the LEDs are typically arranged in a center of the panel so intensity of illumination is lost away from the center resulting in poor uniformity illumination.

Accordingly, what is needed, therefore, is an illumination device with a large-sized panel having satisfactory illumination uniformity.

SUMMARY

In accordance with a preferred embodiment, an illumination device using LEDs has a circuit board assembly and a plurality of LEDs on the circuit board assembly. The circuit board assembly are formed by assembling a plurality of the circuit board elements together. Each of the circuit board elements comprises a board and an electric trace attached to the board. The board comprises a plurality of connecting units formed at lateral sides thereof. Each circuit board element connects with an adjacent circuit board element via the connecting units. The electric trace extends from the board to the connecting units and electrically connects with the electric trace of the adjacent circuit board element.

Other advantages and novel features of the present invention will become more apparent from the following detailed description of preferred embodiment when taken in conjunction with the accompanying drawings, in which:

DETAILED DESCRIPTION OF THE EMBODIMENTS

Figure 1:
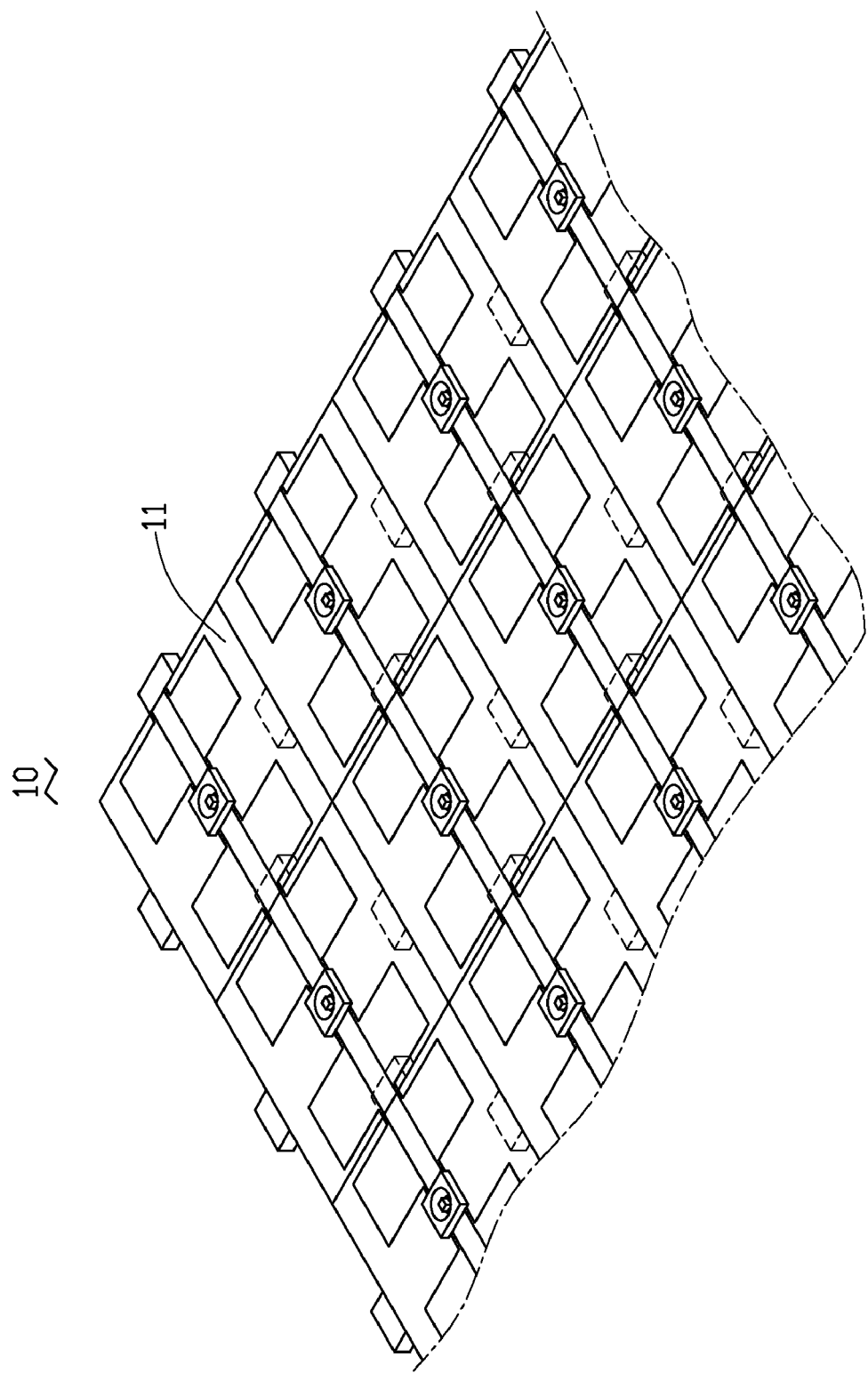
FIG. 1 is an isometric view of part of a circuit board assembly in accordance with a preferred embodiment of the present invention.

Referring to FIG. 1, a circuit board assembly 10 in accordance with a preferred embodiment of the present invention is shown. The circuit board assembly 10 comprises a plurality of circuit board elements 11 arranged side-by-side in a matrix form. Each of the circuit board elements 11 electrically connects with an adjacent circuit board element 11 in rows and columns. The circuit board assembly 10 can be used as an illumination device for providing light.

Figure 2:
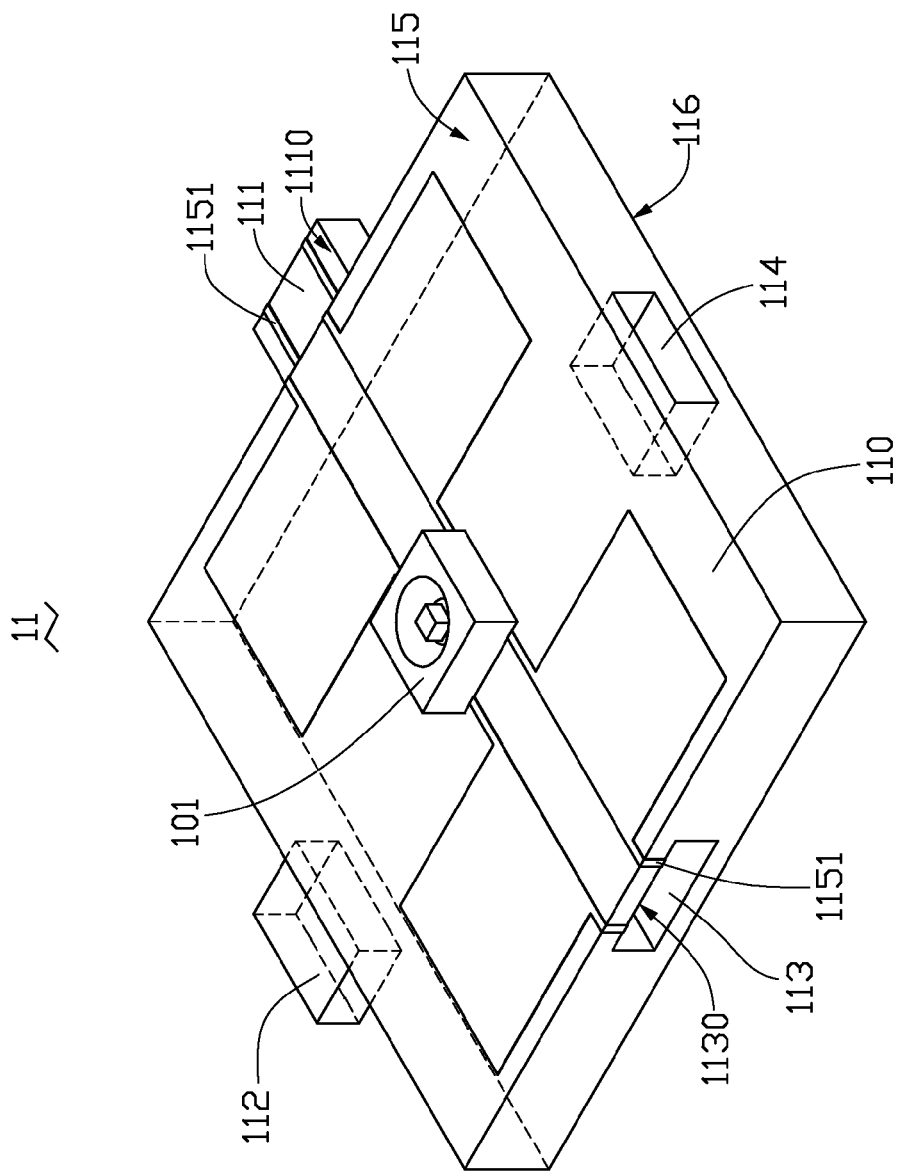
FIG. 2 is an isometric view of a circuit board element of the circuit board assembly shown in FIG. 1.

Referring to FIG. 2, the circuit board element 11 comprises a circuit board which is formed by a board 110 and electrical electric traces 1151 attached to the board 110. The board 110 has a rectangular profile. The board 110 has four connecting units respectively formed at four lateral sides thereof. The circuit board elements 11 connect with adjacent circuit board elements 11 via the connecting units. The connecting units include a first protrusion 111, a first receptacle 113 opposite to the first protrusion 111, a second protrusion 112 and a second receptacle 114 opposite to the second protrusion 112.

The board 110 of the circuit board element 11 has a top surface 115 and an opposite bottom surface 116. An LED 101 is secured to a middle of the top surface 115 of the board 110. The electrical electric traces 1151 are attached to the top surface 115. The electric traces 1151 electrically connect with the LED 101. The first protrusion 111 has an outer, top surface 1110 located at a same side as the top surface 115. The first receptacle 113 has an internal, top surface 1130 adjacent to the top surface 115. Two ends of each of the electric traces 1151 are respectively attached to the outer, top surface 1110 of the first protrusion 111 and the internal, top surface 1130 of the first receptacle 113.

It is to be understood that the profile of the board 110 is not limited to rectangular. The board 110 can also be configured with a triangular profile or a quarter-spherical profile as long as it is easy to assemble the circuit board elements 11. The board 110 is made of an insulative material. It is to be understood that a layer of insulative material or protective material can be used to cover the top surface 115 or the bottom surface 116.

In assembly of the circuit board assembly 10, each circuit board element 11 connects with an adjacent circuit board element 11 in row with the first protrusion 111 engaging in the first receptacle 113 of the adjacent circuit board element 11. Meanwhile, the ends of the electric traces 1151 on the outer, top surface 1110 electrically connect with the corresponding ends of the electric traces 1151 on the internal, top surface 1130 of the adjacent circuit board element 11. Each circuit board element 11 connects with another adjacent circuit board element 11 in column with the second protrusion 112 engaging in the second receptacle 114 of the another adjacent circuit board element 11. It is to be understood that the circuit board assembly 10 with large size can be formed by assembling a plurality of the circuit board elements 111 according to need. As a result, the LEDs 101, which are powered via the electric traces 1151, can emit uniform light from any area of the circuit board assembly 10. Thus, an illumination device using the circuit board assembly 10 can have satisfactory uniform illumination.

In the present embodiment, the board 110 has a thickness of more than or equal to 1 mm. Either of the top surface 115 and bottom surface 116 has a surface area of more than or equal to 1 cm$^2$. A surface area of the electric traces 1151 is 5 percent or more than 5 percent of the surface area of the top surface 115. Thus the circuit board element 11 with the board 110 has a good heat dissipating efficiency. As a result, the LED 101 can be ensured to work normally even though electrical current through the LED 101 on the board 110 is over 100 mA.

Figure 3:
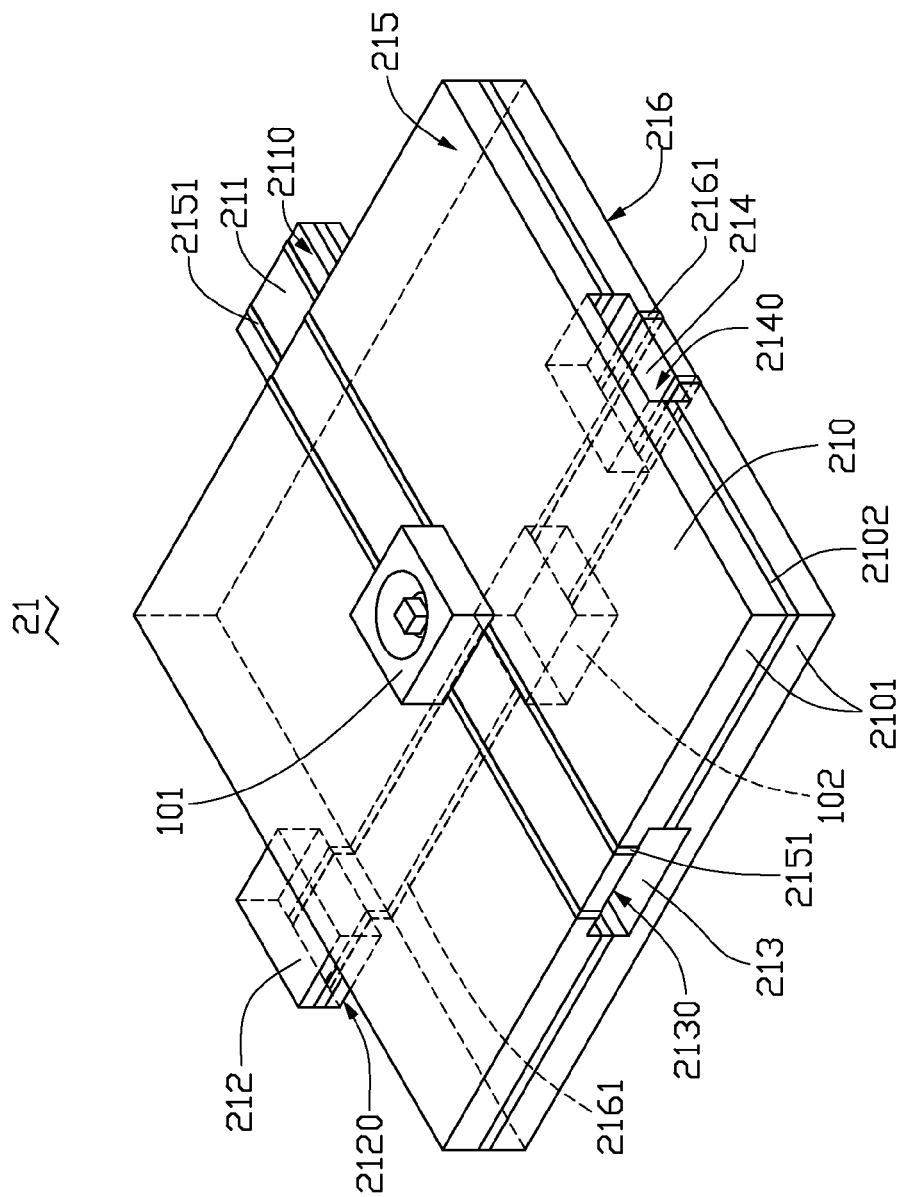
FIG. 3 is an isometric view of a circuit board element in accordance with a second embodiment.

Referring to FIG. 3, a circuit board element 21 used for assembling into a circuit board assembly in accordance with a second embodiment is shown. A plurality of the circuit board elements 21 can be assembled together in a similar manner as the circuit board elements 10 in the above preferred embodiment.

Each circuit board element 21 has a board 210. The board 210 has four connecting units respectively formed at four lateral sides thereof. The connecting units include a first protrusion 211, a first receptacle 213 opposite to the first protrusion 211, a second protrusion 212 and a second receptacle 214 opposite to the second protrusion 212.

The board 210 has a top surface 215 and an opposite bottom surface 216. The top surface 215 has parallel electrical electric traces 2151 attached thereon. The bottom surface 216 has parallel electrical electric traces 2161 attached thereon. The electric traces 2151 are perpendicular to the electric traces 2161. It is to be understood that a layer of insulative material or protective material can be used to cover the top surface 215 and the bottom surface 216. The first protrusion 211 has an outer, top surface 2110 located at a same side as the top surface 215. The first receptacle 213 has an internal, top surface 2130 adjacent to the top surface 215. Two ends of each of the electric traces 2151 are respectively attached to the outer, top surface 2110 of the first protrusion 211 and the internal, top surface 2130 of the first receptacle 213. The second protrusion 212 has an outer, bottom surface 2120 located at a same side as the bottom surface 216. The second receptacle 214 has an internal, bottom surface 2140 adjacent to the bottom surface 216. Two ends of each of the electric traces 2161 are respectively attached to the surfaces 2120, 2140.

In the circuit board assembly composing of the circuit board elements 21, each circuit board element 21 connects with an adjacent circuit board element 21 in row with the first protrusion 211 engaging in the first receptacle 213 of the adjacent circuit board element 21. Meanwhile, the ends of the electric traces 2151 on the outer, top surface 2110 electrically connect with the corresponding ends of the electric traces 2151 on the internal, top surface 2130 of the adjacent circuit board element 21. Each circuit board element 21 connects with another adjacent circuit board element 21 in column with the second protrusion 212 engaging in the second receptacle 214 of the another adjacent circuit board element 21. Meanwhile, the ends of the electric traces 2161 on the outer, bottom surface 2120 electrically connect with the corresponding ends of the electric traces 2161 on the internal, bottom surface 2140 of the another adjacent circuit board element 21. It is to be understood that the circuit board assembly with large size can be formed by assembling a plurality of the circuit board elements 21 according to need. Two LEDs 101, 102 are respectively secured to the top surface 215 and the bottom surface 216. The LEDs 101, 102 electrically connect with the electric traces 2151, 2161 respectively. Thus, an illumination device using the circuit board elements 21 can have uniform illumination regardless of size. The present circuit board assembly 10 may comprise any number of circuit board elements 11 to form a display device of any desired size with superior performance in providing uniform illumination across its display surface.

In the present embodiment, the board 210 comprises two spaced insulation layers 2101 and a metal layer 2102 between the insulation layers 2101. The metal layer 2102 can improve heat dissipation efficiency of the board 210. The electric traces 2151, 2161 are respectively attached to the two insulation layers 2101 and are separate from each other.

Figure 4:
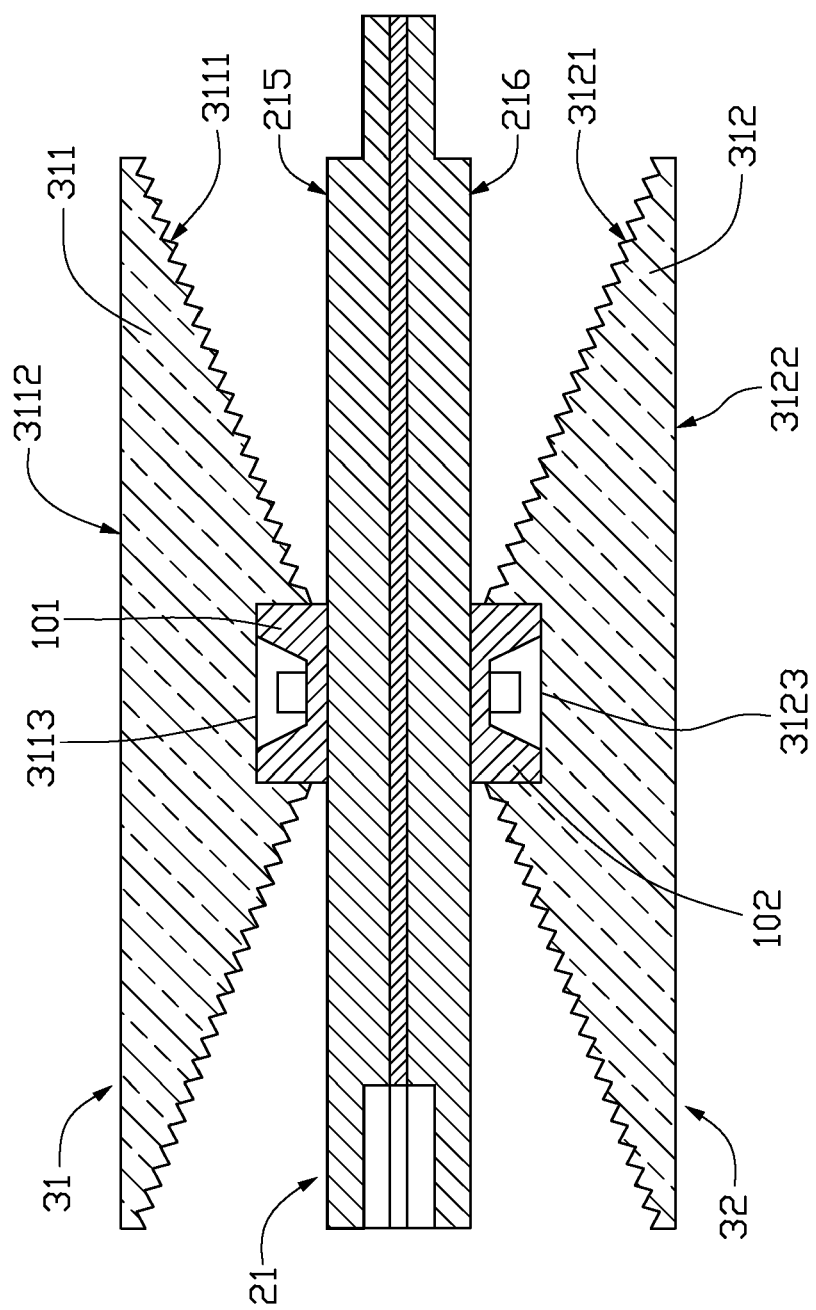
FIG. 4 is a cross-sectional view of an illumination device embodying the circuit board element of FIG. 3.

Referring to FIG. 4, a first light guiding plate 31 and a second light guiding plate 32 are respectively arranged at a top side and a bottom side of the circuit board assembly assembled by the circuit board elements 21. The first light guiding plate 31 comprises a plurality of first light guiding elements 311. The second light guiding plate 32 comprises a plurality of second light guiding elements 312. Each of the first light guiding elements 311 corresponds to a top side of each of the circuit board elements 21. Each of the second light guiding elements 312 corresponds to a bottom side of each of the circuit board elements 21. The light guiding elements 311, 312 each have a rectangular shaped base and a generally triangular or pyramidal profile Also, the light guiding elements 311, 312 can be other shapes, such as triangle or one fourth of sphere.

The first light guiding element 311 has a first surface 3111 adjacent to the top surface 215 of the circuit board element 21 and a second surface 3112 opposite to the first surface 3111. The first surface 3111 defines a groove 3113 in a middle thereof used for receiving the LED 101. The second light guiding element 312 has a first surface 3121 adjacent to the bottom surface 216 of the circuit board element 21 and a second surface 3122 opposite to the first surface 3121. The first surface 3121 defines a groove 3123 in a middle thereof used for receiving the LED 102.

It is to be understood that an illumination device can be formed by assembling a plurality of the circuit board elements 21 and the light guiding plates 31, 32 according to need. Light from the LEDs 101, 102 can be ensured to emit out via dispersion in the light guiding plates 31, 32 so that the illumination device can obtain more uniform illumination.

The first surface 3111 of the first light guiding element 311 defines a plurality of micro structures around the groove 3113. The micro structures are constructed as protrusions and grooves. The protrusions or grooves of the micro structures have V-shaped cross sections. The protrusions or grooves of the micro structures can also be configured with trapezium-shaped cross sections or semispherical cross sections. The first surface 3121 of the second light guiding element 312 also defines a plurality of micro structures being same as that of the first surface 3111. The micro structures can effectively disperse light in the light guiding elements 311, 312 so that the light can emit out from the second surfaces 3112, 3122 evenly. Thus, the illumination device can obtain more uniform illumination.

In the present embodiment, each of the light guiding plates 31, 32 has a thickness of equal to or less than 10 mm so that the illumination device has a light weight and a compact size.

It is to be understood, however, that even though numerous characteristics and advantages of the present circuit board elements 11, 21 have been set forth in the foregoing description, together with details of the structure and function of the preferred embodiments, the disclosure is illustrative only, and changes may be made in detail, especially in matters of shape, size, arrangement of connecting units of the board 110, 210, LEDs, within the principles of the invention to the full extent indicated by the broad general meaning of the terms in which the appended claims are expressed.

What is claimed is:

1. A circuit board element comprising:
    a circuit board including
        a board having
            a first end, a second end opposite to the first end,
            a third end, a fourth end opposite to the third end,
            a first protrusion provided on the first end, a second protrusion provided on the third end,
            a first receptacle defined in the second end, a second receptacle defined in the fourth end; and a first electric trace extending from the first end to the second end, the first electric trace having a first exposed end at the first protrusion and an opposite second exposed end in the first receptacle, the first protrusion being fittingly engaged in the first receptacle of another similar circuit board, a second electric trace extends from the third end to the fourth end, the second electric trace having a first exposed end at the second protrusion and an opposite second exposed end in the second receptacle, the second protrusion being fittingly engaged in the second receptacle of another similar circuit board; and a first light emitting diode and a second light emitting diode mounted on the board, the first light emitting diode being electrically connected with the first electric trace and the second light emitting diode being electrically connected with the second electric trace.

2. The circuit board element as described in claim 1, wherein the board is made of an insulating material.

3. The circuit board element as described in claim 1, wherein at least one of the first electric trace and the second electric trace is embedded in the board.

4. The circuit board element as described in claim 1, wherein the board has a profile selected from the group consisting of rectangle, triangle and quarter-sphere.

5. The circuit board element as described in claim 1, wherein the board has a first surface and a second surface facing away from the first surface, the first electric trace is arranged on the first surface of the board, and a surface area of the first electric trace is 5 percent or more than 5 percent of a surface area of the first surface of the board.

6. The circuit board element as described in claim 1, wherein the board comprises two spaced insulation layers and a metal layer between the two insulation layers.

7. A circuit board assembly comprising: at least two circuit board elements, each two neighboring circuit board elements electrically connecting with each other and mechanically engaged with each other, and each circuit board element comprising a board having
a first end, a second end opposite to the first end,
a third end, a fourth end opposite to the third end,
a first protrusion provided on the first end, a second protrusion provided on the third end,
a first receptacle defined in the second end, a second receptacle defined in the fourth end; and a first electric trace extending from the first end to the second end, the first electric trace having a first exposed end at the first protrusion and an opposite second exposed end in the first receptacle, the first protrusion of one such circuit board element being fittingly engaged in the first receptacle of the other neighboring such circuit board element, the first exposed end of the first electric trace of one such circuit board element being electrically connected with the second exposed end of the first electric trace of the other neighboring such circuit board element, a second electric trace extends from the third end to the fourth end, the second electric trace having a first exposed end at the second protrusion and an opposite second exposed end in the second receptacle, the second protrusion being fittingly engaged in the second receptacle of the other neighboring such circuit board element; and a first light emitting diode and a second light emitting diode mounted on the board, the first light emitting diode being electrically connected with the first electric trace and the second light emitting diode being electrically connected with the second electric trace.

8. An LED based illumination device comprising:

a circuit board comprising a plurality of circuit board elements as described in claim 1, each two neighboring circuit board elements electrically connecting with each other and mechanically engaged with each other; the first protrusion and the second protrusion of one such circuit board element being respectively fittingly engaged in the first receptacle and the second receptacle of the other neighboring such circuit board, the first exposed ends of the first electric trace and the second electric trace of one such circuit board element being respectively electrically connected with the second exposed ends of the first electric trace and the second electric trace of the other neighboring such circuit board element; and a light guiding plate comprising a plurality of light guiding elements spatially corresponding to the circuit board elements.

9. The LED based illumination device as described in claim 8, wherein the light guiding elements each have a first surface adjacent to the circuit board element and a second surface opposite to the first surface, the first surface defines a recess receiving the respective first LED, the first surface defines a plurality of micro structures around the recess.

10. The LED based illumination device as described in claim 9, wherein a cross section of each of the micro structures has a shape selected from the group consisting of V shape, trapezium shape and semispherical shape.

11. The LED based illumination device as described in claim 8, wherein the electric trace or the second electric trace is embedded in the board.

12. The LED based illumination device as described in claim 8, wherein the board comprises two spaced insulation layers and a metal layer between the two insulation layers.

13. The LED based illumination device as described in claim 8, wherein the circuit board elements are electrically connecting with each other in rows and columns.

14. The LED based illumination device as described in claim 8, wherein the board has a first surface and a second surface facing away from the first surface, the first electric trace is arranged on the first surface of the board, and a surface area of the electric trace is 5 percent or more than 5 percent of a surface area of the first surface of the board.

15. The circuit board element as described in claim 5, wherein the second electric trace is arranged on the second surface of the board.

16. The circuit board element as described in claim 15, wherein a surface area of the second electric trace is 5 percent or more than 5 percent of a surface area of the second surface of the board.

17. The circuit board element as described in claim 15, wherein the second electric trace is perpendicular to the first electric trace.

18. The LED based illumination device as described in claim 14, wherein the second electric trace is arranged on the second surface of the board.

19. The LED based illumination device as described in claim 18, wherein a surface area of the second electric trace is 5 percent or more than 5 percent of a surface area of the second surface of the board.

20. The LED based illumination device as described in claim 18, wherein the second electric trace is perpendicular to the first electric trace.

* * * * *